United States Patent
Okazaki

(10) Patent No.: US 7,646,238 B2
(45) Date of Patent: Jan. 12, 2010

(54) AMPLIFICATION APPARATUS

(75) Inventor: Takashi Okazaki, Hamura (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 68 days.

(21) Appl. No.: 12/010,504

(22) Filed: Jan. 25, 2008

(65) Prior Publication Data

US 2008/0186095 A1 Aug. 7, 2008

(30) Foreign Application Priority Data

Feb. 1, 2007 (JP) .............................. 2007-023345

(51) Int. Cl.
*H03F 1/26* (2006.01)

(52) U.S. Cl. ...................................... 330/149; 375/297

(58) Field of Classification Search .................. 330/149; 375/297; 455/114.3

See application file for complete search history.

(56) References Cited

U.S. PATENT DOCUMENTS

| | | | | |
|---|---|---|---|---|
| 5,699,383 | A * | 12/1997 | Ichiyoshi | ...................... 375/297 |
| 5,920,808 | A * | 7/1999 | Jones et al. | ................ 455/127.1 |
| 7,020,447 | B2 * | 3/2006 | Nagatani et al. | ........... 455/114.3 |
| 7,259,630 | B2 * | 8/2007 | Bachman et al. | ............. 330/297 |
| 7,403,573 | B2 * | 7/2008 | DeBruyn et al. | ............. 375/297 |
| 7,415,250 | B2 * | 8/2008 | Sasaki et al. | .............. 455/114.2 |

FOREIGN PATENT DOCUMENTS

| | | |
|---|---|---|
| JP | A-2001-320246 | 11/2001 |
| JP | A-2004-040369 | 2/2004 |

* cited by examiner

*Primary Examiner*—Henry K Choe
(74) *Attorney, Agent, or Firm*—Oliff & Berridge, PLC

(57) ABSTRACT

The contents of a distortion compensation table for adjusting a waveform of a signal input to an amplification apparatus are more precisely adjusted to suppress distortion occurring in an output signal. A table value calculation unit exercises adaptive control over compensation data I and Q according to the perturbation method using power series to update a power series distortion compensation table when distortion of an output signal from a power amplification unit is greater than a first threshold used in the adaptive control process performed on the compensation data I and Q according to the perturbation method using power series. When the distortion of the output signal from the power amplification unit is smaller than the first threshold used in the adaptive control process performed on the compensation data I and Q according to the perturbation method using power series, the table value calculation unit performs an adaptive control process on the compensation data I and Q according to the perturbation method based on interpolation using representative points to update a representative point interpolation distortion compensation table.

2 Claims, 11 Drawing Sheets

AMPLIFICATION APPARATUS

BACKGROUND OF THE INVENTION

1. Field of the Invention

The present invention relates to an amplification apparatus which compensates for distortion.

2. Description of the Related Art

For example, Patent Documents 1 and 2 disclose amplification apparatus configured to adjust a waveform of a signal input thereto using a distortion compensation table to compensate for distortion which can occur in an output signal obtained by amplification.

Patent Document 1: JP-A-2004-40369

Patent Document 2: JP-A-2001-320246

The invention was made based on the technical background described above, and it is an object of the invention to provide an amplification apparatus having improved capability of suppressing distortion occurring in an output signal by more precisely adjusting the contents of a distortion compensation table used for adjusting a waveform of an input signal.

SUMMARY OF THE INVENTION

In order to achieve the above-described object, an amplification apparatus according to the invention includes a transmission data power value calculation unit for calculating the power value of digital transmission data to be transmitted, a transmission data modifying unit for modifying the transmission data based on compensation data, a transmission signal generation unit for generating an analog transmission data from the modified transmission data, an amplification unit for amplifying the transmission signal while imparting predetermined characteristics to the same, a distortion detecting unit for detecting distortion of the amplified transmission signal, a compensation data table changing unit for changing values in a compensation data table used for generating the compensation data based on the detected distortion, and a compensation data unit for generating the compensation data based on the calculated power value of the transmission data and the values in the compensation data table. The compensation data table changing unit carries out a first perturbation method or a second perturbation method using the detected distortion of the transmission signal and the values in the compensation data table to change the values in the compensation data table.

Preferably, the first perturbation method is a perturbation method using power series, and the second perturbation method is a perturbation method based on interpolation using representative values.

Preferably, the compensation data table changing unit updates the values in the compensation data table according to the perturbation method using power series when the detected distortion of the transmission signal is equal to or greater than a predetermined threshold. The unit updates the values in the compensation data table according to the perturbation method based on interpolation using representative values when the detected distortion of the transmission signal is equal to or greater than another predetermined threshold.

An amplification apparatus according to the invention can suppress distortion which occurs in an output signal by more precisely adjusting the contents of a distortion compensation table used for adjusting a waveform of an input signal.

DESCRIPTION OF THE PREFERRED EMBODIMENT

[Description Regarding Development of the Invention]

Prior to the description of a preferred embodiment of the invention, the development of the invention will be described further for better understanding of an amplification apparatus according to the invention.

For example, in a W-CDMA (Wide-band Code Division Multiple Access) type mobile communication system, radio signals must be transmitted between an apparatus at a base station and an apparatus at a mobile station which is physically distant from the base station apparatus.

When there is a great distance between the base station apparatus and the mobile station apparatus, radio signals having high power are required between those apparatus, and a signal to be transmitted must be amplified by a power amplification apparatus having a great power gain to meet the requirement.

In general, a power amplification apparatus for such an application employs power amplification utilizing an analog device.

However, input/output characteristics of a power amplification apparatus utilizing an analog device are not necessarily linear. Therefore, when the power amplification apparatus receives an input signal having power in the adjacency of an amplification limit, which is also called a saturation point, of such input/output characteristics, a resultant output signal may not have power proportionate to the power of the input signal.

The above-described relationship between input and output signals of a power amplification apparatus is sometimes called non-linearity of input/output characteristics, and non-linear distortion can occur in an output signal because of such non-linearity.

A band limiting filter is used to prevent signal leakage between signals input to a power amplification apparatus over channels adjacent to each other among a plurality of channels included in inputs and outputs of the apparatus (adjacent channels).

However, when non-linear distortion occurs in output signals from a power amplification apparatus, leakage can occur between signals in adjacent channels.

For example, at a base station in a W-CDMA type communication system as described above, a strict standard is used to limit leakage between signals in adjacent channels because output signals handled at the station have high power.

It is therefore required to reduce non-linear distortion which occurs in a power amplification apparatus and to reduce signal leakage between adjacent channels consequently.

The main stream of efforts toward reduction of non-linear distortion is changing from the feed forward method to the pre-distortion method in which compensation is provided for possible distortion after power amplification by inputting a signal to a power amplification apparatus after adjusting the waveform of the input signal in advance such that no distortion occurs after power amplification.

Figure 1A:
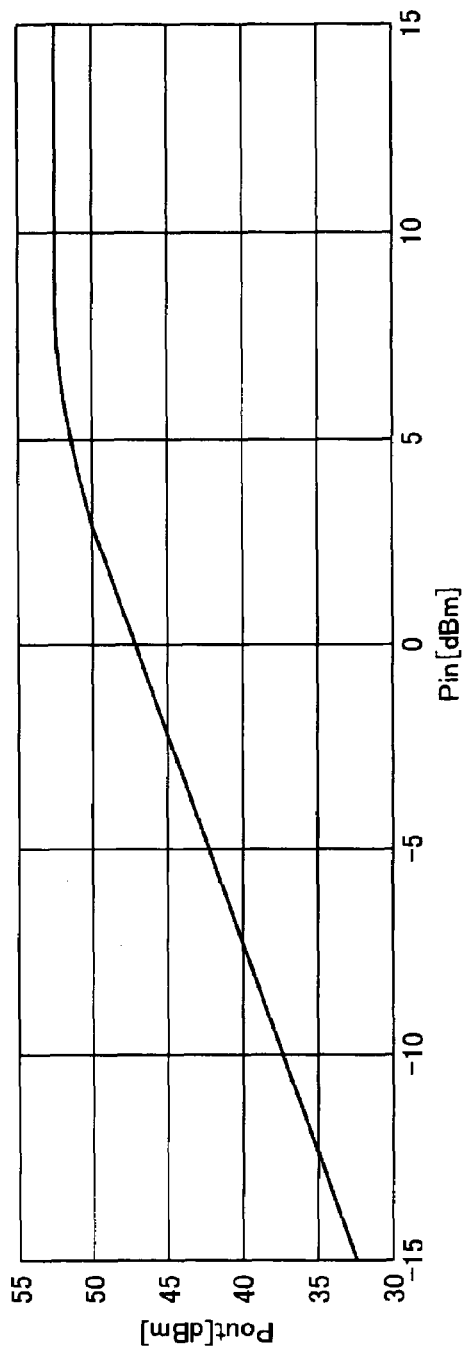
FIGS. 1A and 1B are graphs showing examples of AM/AM characteristics and AM/PM characteristics, FIG. 1A showing AM/AM characteristics, FIG. 1B showing AM/PM characteristics.
Figure 1B:
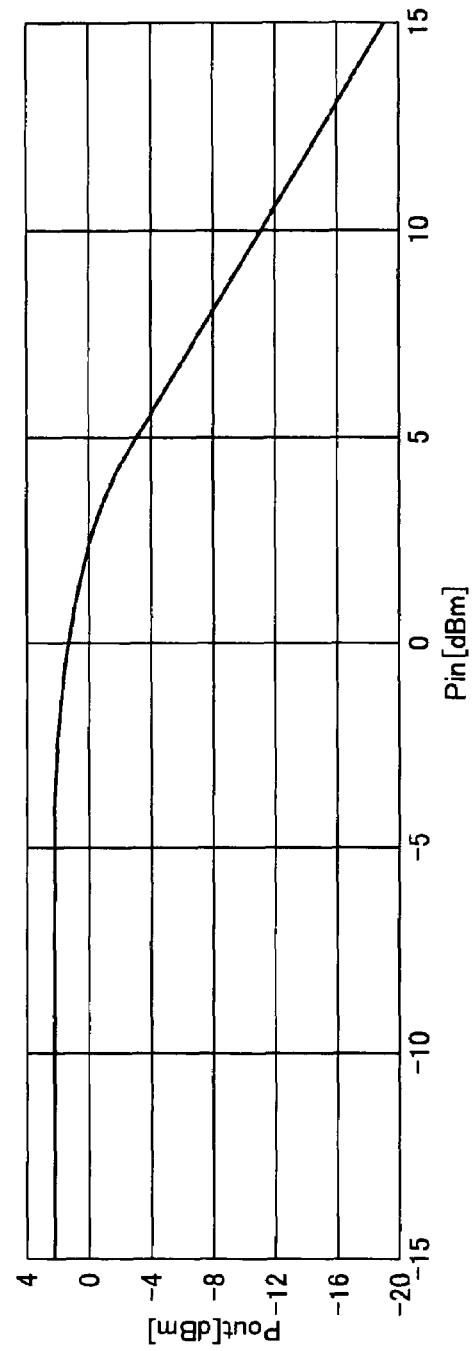

FIGS. 1A and 1B show examples of AM/AM characteristics and AM/PM characteristics in the form of graphs. FIG. 1A shows AM/AM characteristics, and FIG. 1B shows AM/PM characteristics.

In the graphs shown in FIGS. 1A and 1B, output power values (dBm) are shown along the ordinate axes, and input power values (dBm) are shown along the abscissa axes.

According to the pre-distortion method, a waveform of an input signal is pre-distorted to adjust the waveform of the input signal so as to obtain characteristics which are the reverse of AM/AM characteristics and AM/PM characteristics generated between the input signal and an output signal.

AM/AM characteristics are characteristics of output amplitude values relative to input amplitude values as shown in FIG. 1A, and AM/PM characteristics are characteristics of output phases relative to input amplitude values as shown in FIG. 1B.

When an input signal having a waveform adjusted as thus described is subjected to power amplification at a power amplification apparatus, distortion imparted to the input signal and non-linear distortion imparted by the power amplification apparatus are canceled by each other. Thus, distortion of an output signal from the power amplification apparatus can be kept small while keeping the efficiency of the apparatus high.

First Embodiment

A first embodiment of the invention will now be described.

[First Amplification Apparatus 10]

Figure 2:
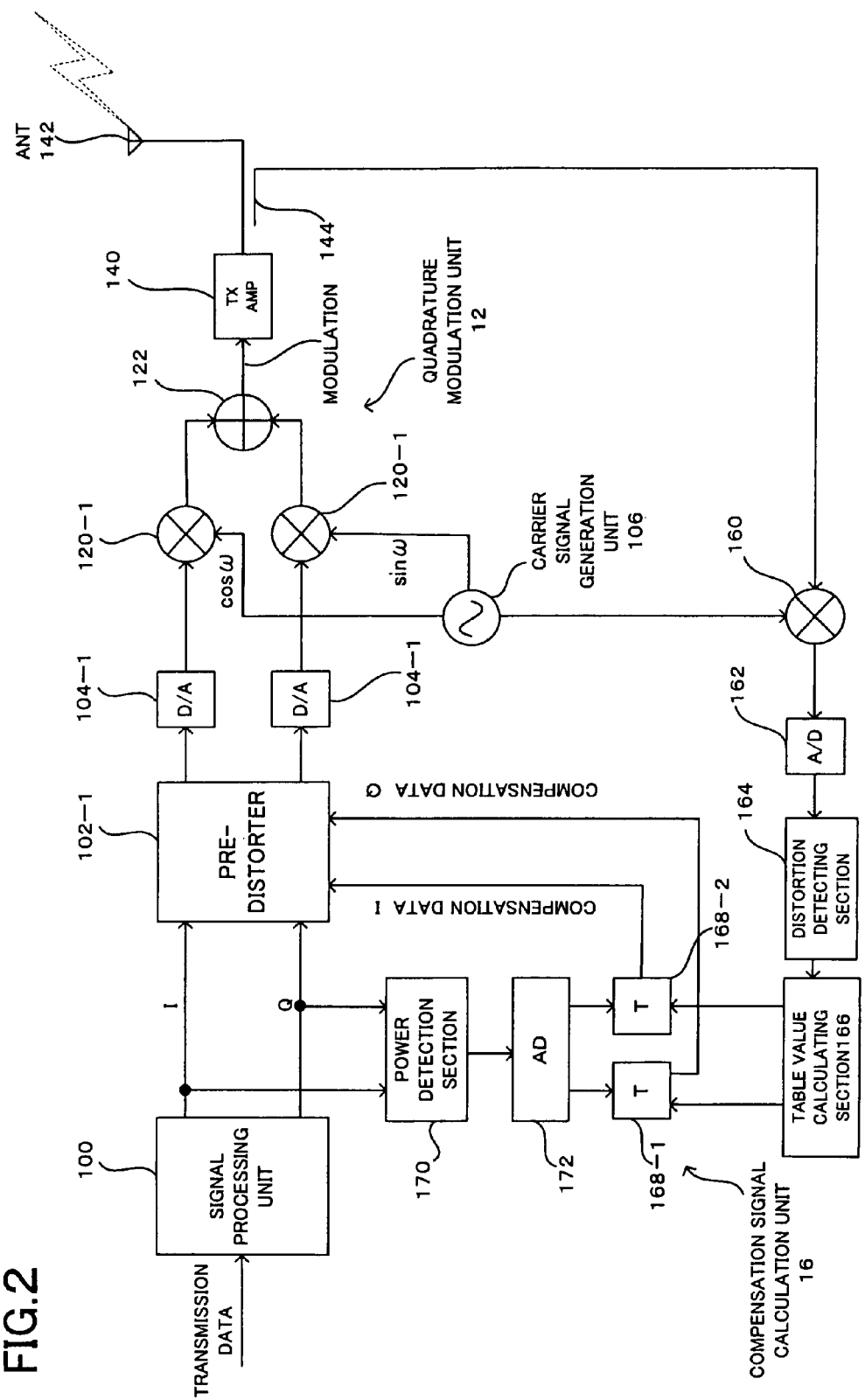
FIG. 2 is a diagram showing a configuration of a first amplification apparatus according to the invention.

FIG. 2 is a diagram showing a configuration of a first amplification apparatus 10 according to the invention.

As shown in FIG. 2, the first amplification apparatus 10 includes a signal processing unit 100, a pre-distorter 102, digital-to-analog conversion units (D-A units) 104-1 and 104-2, a carrier signal generation unit 106, an quadrature modulation unit 12, a power amplification unit (TX-AMP) 140, an antenna 142, a coupling unit 144, and a first compensation data calculation unit 16.

The quadrature modulation unit 12 includes multiplying units 120-1 and 120-2 and an adding unit 122.

The compensation data calculation unit 16 includes a down converter unit 160, an analog-digital conversion circuit unit (A-D unit) 162, a distortion detecting unit 164, a first table value calculating unit 166, distortion compensation tables (T) 168-1 and 168-2, a power detecting unit 170, and an address calculating unit (AD) 172.

Hereinafter, when reference is made to a plurality of identical constituents like the distortion compensation tables 168-1 and 168-2 without specifying which of the constituents the reference is made to, such constituents may be designated using a simplified reference numeral (e.g., distortion compensation table(s) 168).

In the accompanying drawings, constituents which are substantially identical to each other are indicated by the same reference numeral.

For example, the amplification apparatus 10 is used as a transmitter of a base station apparatus of a W-CDMA type mobile communication system.

In the amplification apparatus 10, the constituents as thus described impart pre-distortion to the values of I-channel data and Q-channel data obtained from data to be transmitted such that non-linearity of the power amplification unit 140 is canceled. Thus, a waveform of a signal (modulated signal) input to the power amplification unit 140 is adjusted, and distortion compensation is performed on a pre-distortion basis.

The amplification apparatus 10 amplifies and transmits the modulated signal.

Figure 3:
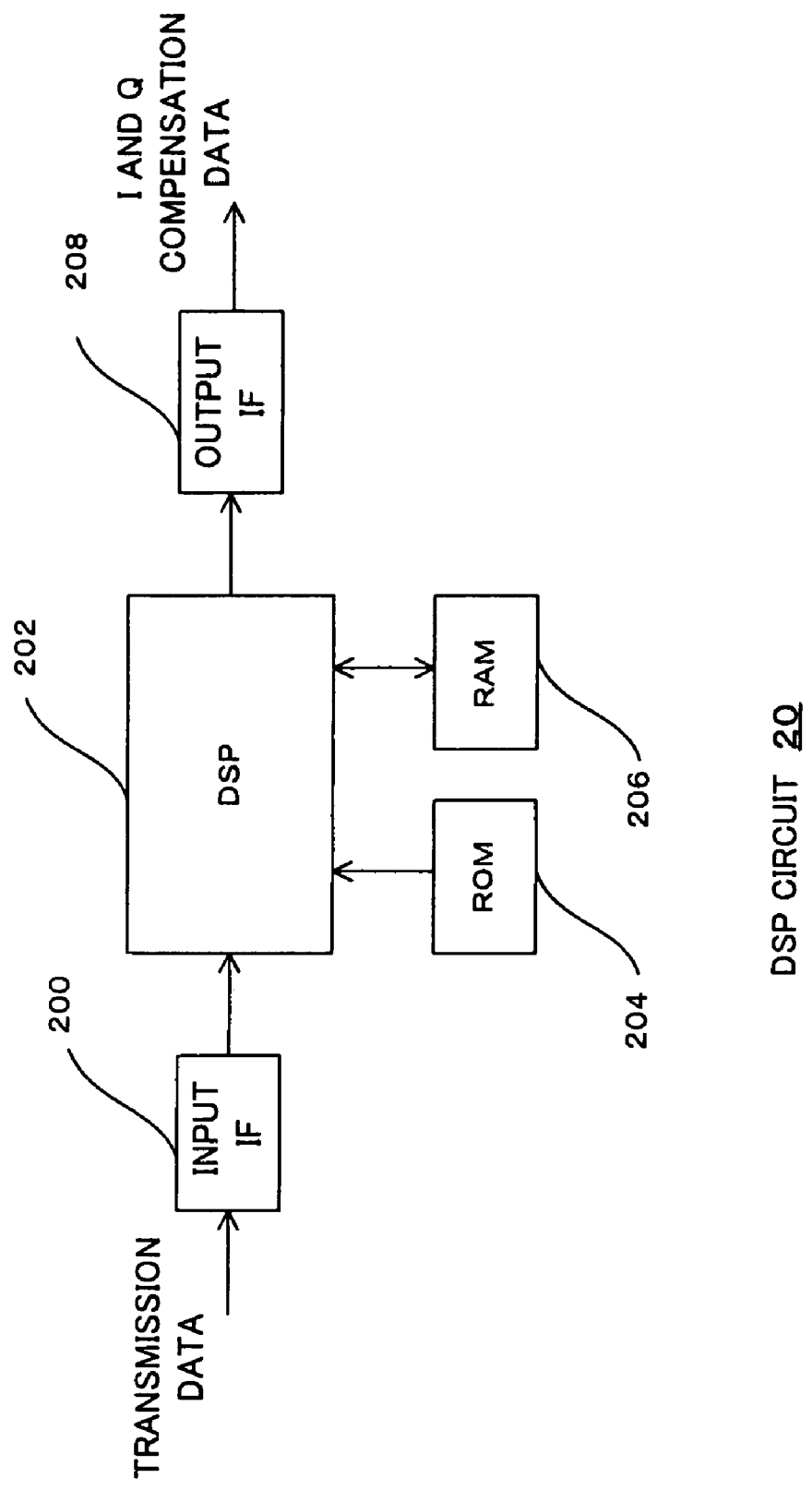
FIG. 3 is a diagram showing a DSP circuit used in the amplification apparatus shown in FIG. 2.

FIG. 3 is a diagram showing a DSP circuit 20 used in the amplification apparatus 10 shown in FIG. 2.

The DSP circuit 20 includes an input interface circuit 200 (input IF), a DSP (digital signal processor) 202, a ROM circuit 204, a RAM circuit 206, and an output interface circuit (output IF) 208.

The DSP circuit 20 executes programs stored in the ROM circuit 204 and the like using those constituents to perform signal processing.

Among the constituents of the amplification apparatus 10 shown in FIG. 2, parts having functions which can be achieved by digital processing can be implemented in the form of programs stored in the ROM 204 of the DSP circuit 20 shown in FIG. 3.

Specifically, constituents of the amplification apparatus 10 which can be implemented in the form of programs stored in the ROM circuit 204 are, for example, the signal processing unit 100, the pre-distorter 102, the distortion detecting unit 164, the table value calculating unit 166, the distortion compensation table 168, the power detecting unit 170, and the address calculating unit 172 (this applies to each of amplification apparatus described below).

The signal processing unit 100 of the amplification apparatus 10 (FIG. 2) processes transmission data to generate I-channel data and Q-channel data and outputs the data to the pre-distorter 102 and the power detecting unit 170.

The pre-distorter 102 carries out complex multiplication between the I-channel data and Q-channel data input from the signal processing unit 100 and compensation data I and compensation data Q input from the distortion compensation table 168-1. Thus, distortion is imparted to compensate for non-linearity of the power amplification unit 140, and the data are output to the D-A unit 104-1 and 104-2 with their waveforms adjusted.

The D-A unit 104-1 performs D-A conversion of the I-channel data input from the pre-distorter 102 to obtain an I-channel signal which is then output to the multiplying unit 120-1 of the quadrature modulation unit 12.

The D-A unit 104-2 performs D-A conversion of the Q-channel data input from the pre-distorter 102 to obtain a Q-channel signal which is then output to the multiplying unit 120-2 of the quadrature modulation unit 12.

The quadrature modulation unit 12 performs quadrature modulation of the I-channel signal and the Q-channel signal input from the D-A units 104-1 and 104-2 using a carrier signal input from the carrier signal generating unit 106, and resultant modulated signals are output to the power amplification unit 140.

The multiplying unit 120-1 multiplies the I-channel signal input from the D-A unit 104-1 by a cosine component of the carrier signal and outputs the product to the adding unit 122.

The multiplying unit 120-2 multiplies the Q-channel signal input from the D-A unit 104-2 by a sine component of the carrier signal and outputs the product to the adding unit 122.

The adding unit 122 adds the multiplied signals input from the multiplying units 120-1 and 120-2, and a resultant modulated signal is output to the power amplification unit 140.

The power amplification unit 140 amplifies the modulated signals input from the quadrature modulation unit 12 with predetermined input/output characteristics using an analog device and outputs a resultant signal to the antenna 142 through the coupling unit 144 as an output signal.

As described above in the unit addressing the development of the invention, the power amplification unit 140 has such input/output characteristics that the power value of an output signal obtained by amplifying an input signal having high power will not be proportionate to the power value of the input signal.

The output signal input to the antenna 142 is transmitted to a mobile station apparatus (not shown) as a radio signal through a radio communication link.

The coupling unit 144 couples outputs of the power amplification unit 140 to the down converter unit 160 of the compensation data calculation unit 16 and outputs part of the output signal to the down converter unit 160.

The down converter unit 160 of the compensation data calculation unit 16 converts the part of the output signal of the power amplification unit 140 into a base band signal (a signal associated with the modulated signals output by the quadrature modulation unit 12) using the carrier signal from the carrier signal generating unit 106 and outputs the signal to the A-D unit 162.

The A-D unit 162 performs analog-to-digital conversion of the base band signal input from the down converter unit 160 to obtain base band data in a digital form and outputs the data to the distortion detecting unit 164.

The distortion detecting unit 164 detects distortion of the output signal from the power amplification unit 140 and outputs the result to the table value calculating unit 166.

Specifically, the distortion detecting unit 164 converts the base band data input from the A-D unit 162 into data in the frequency domain using an FFT and calculates the band power of the distortion or measures the power of the frequency band of the distortion using a BPF (band pass filter).

The distortion detecting unit 164 detects the distortion of the output signal from the power amplification unit 140 as an amount of signal leakage in the frequency band of the distortion.

The power detecting unit 170 detects the power values of the I-channel data and the Q-channel data input from the signal processing unit 100 and outputs them to the address calculating unit 172.

The address calculating unit 172 generates addresses in the distortion compensation tables 168-1 and 168-2 associated with normalized power values x (which satisfies $1 > x \geqq 0$ where an input voltage assumes a maximum value when x=1) of the I-channel data and the Q-channel data input from the power detecting unit 170, the addresses being adjusted such that the maximum input voltage value stays within the final range of addresses in the distortion compensation tables 168. The addresses are then output to the distortion compensation tables 168-1.

The distortion compensation tables 168-1 and 168-2 outputs the values stored therein indicated by the addresses input from the address calculating unit 172 to the pre-distorter 102 as compensation data I and Q.

Addresses in the distortion compensation tables 168-1 and 168-2 are used as distortion compensation table addresses, and distortion compensation table values of the data I and Q are stored in respective distortion compensation table addresses.

The table value calculating unit 166 processes the distortion of the output signal of the power amplification unit 140 input from the distortion detecting unit 164 using coefficients ($OA_3$, $OA_5$, $OA_7$, $OP_3$, $OP_5$, and $OP_7$ which will be described later) used for the calculation of the values (compensation data I and Q) stored in the distortion compensation tables 168. Thus, the values (compensation data I and Q) stored in the distortion compensation tables 168-1 and 168-2 are controlled (adjusted) in an adaptive manner according to temperature changes and the like.

Specifically, when the data are updated using power series, the table value calculating unit 166 monitors a change in distortion or an increase or decrease in distortion and updates the compensation data I and Q by operating coefficients of one of equations described below.

In the case of updating based on interpolation using representative points, the table value calculating unit 166 updates one representative point in either of the tables from the observed change in distortion to update the compensation data I and Q consequently.

A further description will be made later on details of the compensation data I and Q stored in the distortion compensation tables 168-1 and 168-2 and on the adaptive control of the values (compensation data I and Q) stored in the distortion compensation tables 168-1 and 168-2 exercised by the table value calculating unit 166.

[Values Stored in Distortion Compensation Tables 168]

A description will now be made on the values stored in the distortion compensation tables 168.

The compensation data I and Q stored in the distortion compensation tables 168-1 and 168-2 represent characteristics which are the reverse of non-linear characteristics of the power amplification unit 140 which is to be compensated.

In general, the compensation data I stored in the distortion compensation table 168-1 include amplitude conversion data whose indices (addresses) are normalized power values x of the I-channel data input from the address calculating unit 172-1 and which are used for AM-AM (amplitude) conversion performed by the pre-distorter 102 for each of the power values in the I-channel data. The data I also include phase conversion data used for AM-PM (phase) conversion.

Similarly, the compensation data Q stored in the distortion compensation table 168-2 include amplitude conversion data whose indices (addresses) are normalized power values x of the Q-channel data input from the address calculating unit 172-2 and which are used for AM-AM (amplitude) conversion performed by the pre-distorter 102 for each of the power values in the Q-channel data. The data Q also include phase conversion data used for AM-PM (phase) conversion.

Specifically, what is stored in the distortion compensation tables 168-1 and 168-2 is reserve characteristics data which are data obtained by reversing the AM-AM characteristics and AM-PM characteristics of the I and Q data shown in FIGS. 1A and 1B.

Data to be transmitted are complex multiplied by the reverse characteristics data to perform AM-AM conversion and AM-PM conversion.

Figure 4:
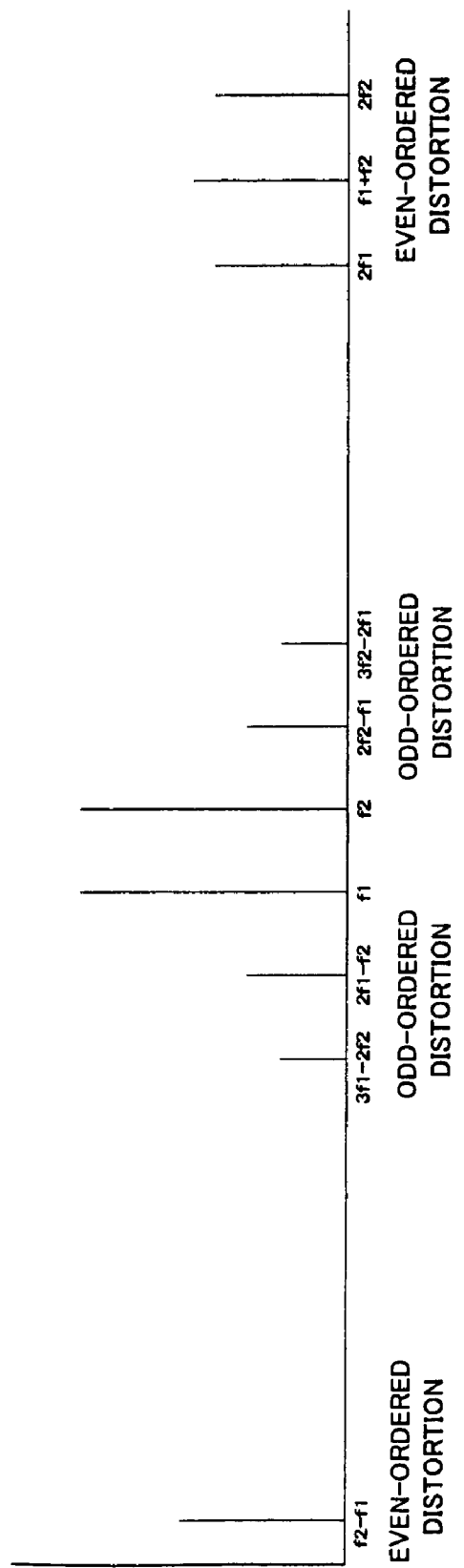
FIG. 4 is an illustration showing examples of distortion that occurs in signals output by a power amplification unit.

FIG. 4 is an illustration showing examples of distortions that occur in signals output by the power amplification unit 140.

As already described, non-linear distortion occurs in an output signal from the power amplification unit 140 because of non-linearity between the input and output of the power amplification unit 140.

Non-linear distortion occurring in the adjacency of a carrier signal included in the output signal is attributable to intermodulation of odd orders such as third, fifth, and seventh orders that occur near the carrier signal as shown in FIG. 4.

Distortion of even order such as second, fourth, or sixth order of the carrier signal can be easily eliminated using a filter because it includes only frequency components in the adjacency of a DC component or harmonics components having a frequency equal to or higher than twice the frequency of the carrier signal.

Therefore, even-ordered distortion of a carrier signal does not constitute a source of non-linear distortion in the adjacency of the carrier signal.

For the above-described reason, the compensation data I and Q to be stored in the distortion compensation tables 168-1 and 168-2 are obtained from Equations 1-1 and 1-2 shown below using normalized power values x and are stored in addresses of the distortion compensation tables 168-1 and 168-2 associated with the normalized power values x.

Amplitude Conversion Data $A(x) = OA_3 x^2 + OA_5 x^4 + OA_7 x^6 + 1$    Equation 1-1

Phase Conversion Data $P(x) = OP_3 x^2 + OP_5 x^4 + OP_7 x^6$    Equation 1-2

Compensation Data $I = A(x)\cos(P(x))$    Equation 1-3

Compensation Data $Q = A(x)\sin(P(x))$    Equation 1-4

In Equation 1-1, $OA_3$ is a coefficient for compensating for a distorted amplitude (third-order distortion) attributable to a intermodulation of third order; $OA_5$ is a fifth-order distortion amplitude compensation coefficient; and $OA_7$ is a seventh-order amplitude compensation coefficient.

In Equation 1-2, $OP_3$ is a coefficient for compensating for a distorted phase (third-order distortion) attributable to a intermodulation of third order; $OP_5$ is a fifth-order distortion phase compensation coefficient; and $OP_7$ is a seventh-order distortion phase compensation coefficient.

The coefficients $OA_3$, $OA_5$, $OA_7$, $OP_3$, $OP_5$, and $OP_7$ are obtained by the table value calculating unit 166 through calculations based on results of measurement of the input/output characteristics of the power amplification unit 140 or through experiments such as measurement of distortion of output signals from the amplification apparatus 10.

[Adaptive Control by Table Value Calculating Unit 166]

A description will now be made on adaptive adjustment (adaptive control) of values stored in the distortion compensation tables 168-1 and 168-2 performed by the table value calculating unit 166.

Figure 5:
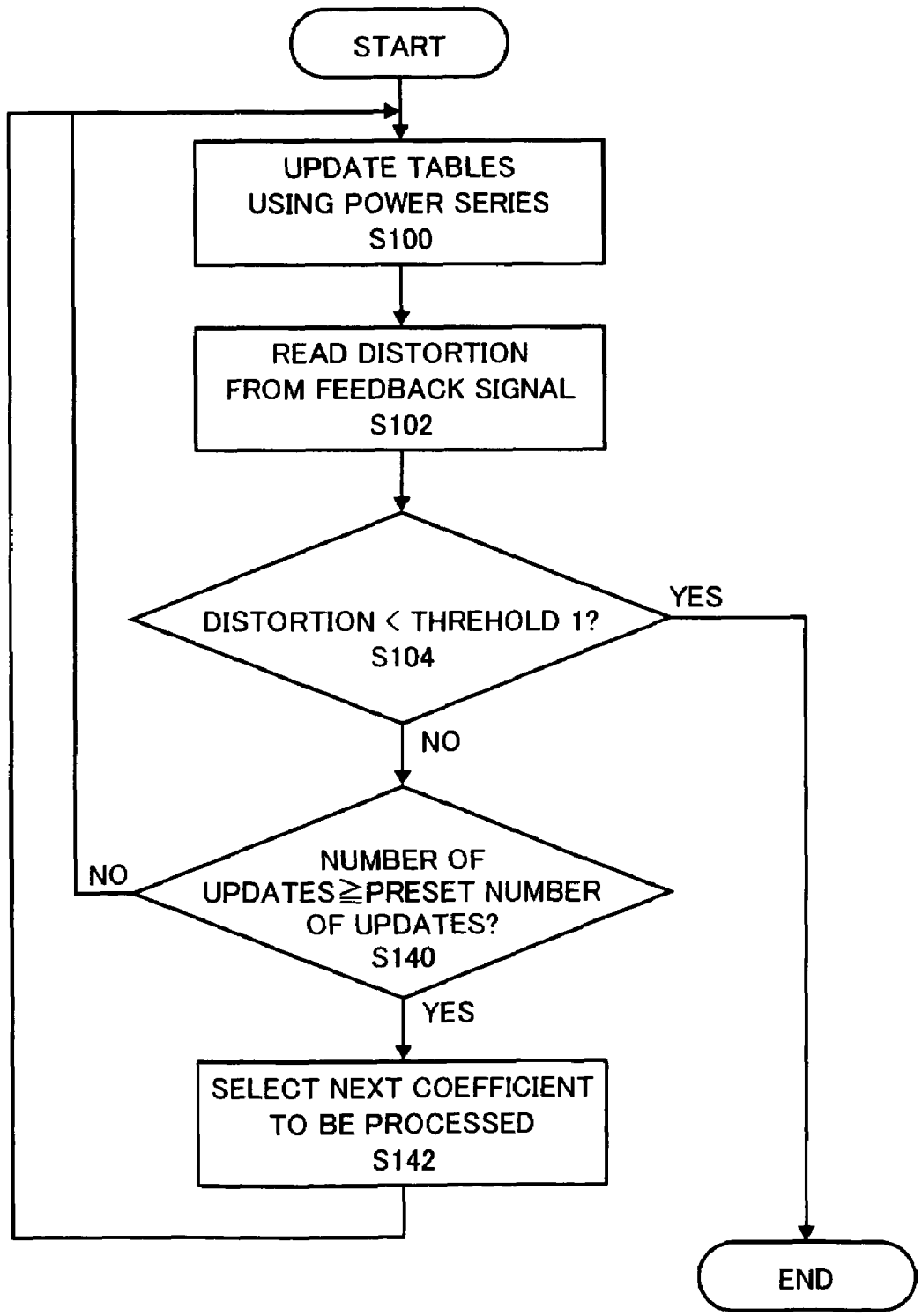
FIG. 5 shows an adaptive control process (S10) according to the perturbation method carried out using power series of values stored in distortion compensation tables obtained by the table value calculating unit shown in FIG. 2.

FIG. 5 shows an adaptive control process (S10) according to the perturbation method carried out using power series of the values stored in the distortion compensation tables 168 obtained by the table value calculating unit 166 shown in FIG. 2 (series defined in the form of $\Sigma a_n x^n$).

As shown in FIG. 5, the table value calculating unit 166 starts the adaptive control process on the distortion compensation tables 168, for example, starting with the coefficient $OA_3$.

At step 100 (S100), the table value calculating unit 166 increases or decreases a coefficient to be processed (any of the coefficients $OA_3$, $OA_5$, $OA_7$, $OP_3$, $OP_5$, and $OP_7$) in a predetermined stepwise manner to calculate all compensation data I using Equation 1-1 or 1-2 shown above and stores the data in the distortion compensation table 168-1.

Similarly, the table value calculating unit 166 increases or decreases a coefficient to be processed in a predetermined stepwise manner to calculate all compensation data Q using Equation 1-1 or 1-2 shown above and stores the data in the distortion compensation table 168-2 to update the same.

At step 102 (S102), the table value calculating unit 166 reads distortion which has been detected by the distortion detecting unit 164 from an output signal of the power amplification unit 140 fed back through the coupling unit 144, the down-converter unit 160, and the A-D unit 162.

At step 104 (S104), the table value calculating unit 166 determines whether the value of the distortion thus read is greater than a predetermined threshold or not.

When the value of the distortion read is greater than a first predetermined threshold, the table value calculating unit 166 proceeds to the process at step 140. Otherwise, the unit terminates the process.

The coefficients $OA_3$, $OP_3$, $OA_5$, $OP_5$, $OA_7$, and $OP_7$ are updated in the order listed. When the adaptive control process is completed for all coefficients, the process returns to the update of the coefficient $OA_3$, and the distortion compensation coefficient updating process is continued.

The condition to terminate the process is that the magnitude of a detected distortion is smaller than a target value of distortion.

At step 140 (S140), the table value calculating unit 166 determines whether the number of updates of the coefficient of interest has exceeded a preset number of updates.

When the number of updates has exceeded the established number of updates, the table value calculating unit 166 proceeds to the process at step 142. Otherwise, the process at step S100 is performed again.

At step 142 (S142), the table value calculating unit 166 selects any of the coefficients $OA_3$, $OA_5$, $OA_7$, $OP_3$, $OP_5$, and $OA_7$ which has not been subjected to the adaptive control process as the object of the adaptive control process, and the process at step 100 is performed again.

The above-described processing method may be hereinafter also referred to as "perturbation method using power series".

Figure 6:
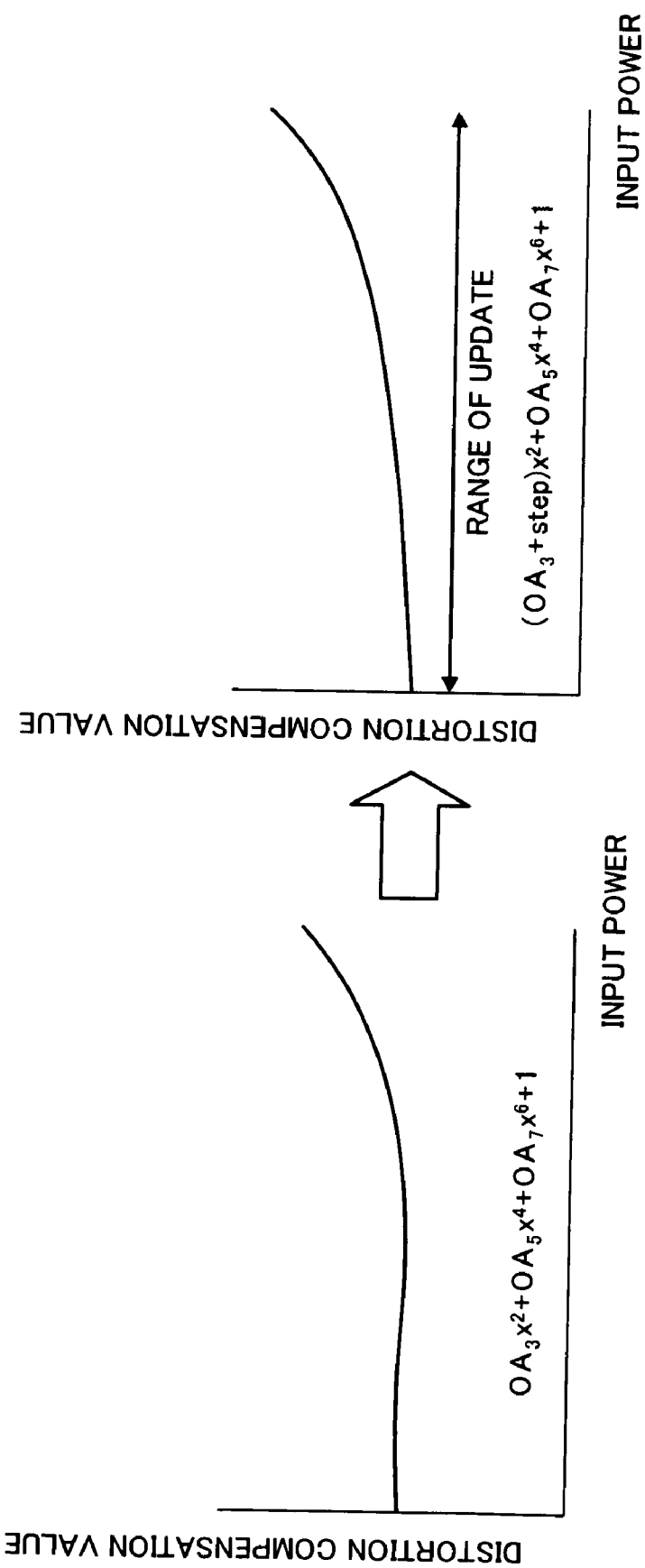
FIG. 6 is graphs showing an example of updating of amplitude conversion data among values (compensation data I and Q) stored in the distortion compensation tables (FIG. 2) which have been updated through the adaptive control process according to the perturbation method using power series shown in FIG. 5.

FIG. 6 is graphs showing an example of updating of amplitude conversion data among the values (compensation data I and Q) stored in the distortion compensation tables 168 (FIG. 2) which have been updated through the adaptive control process according to the perturbation method using power series shown in FIG. 5.

In the first amplification apparatus 10 described above (and shown in FIG. 2), the compensation data I and Q stored in the distortion compensation tables 168 are updated in all regions thereof (x=0 to 1) as shown in FIG. 6 by the adaptive control process shown in FIG. 5.

According to this method, as indicated by the curves indicating stored values in FIG. 6, the compensation data I and Q are updated by one process including those in regions where input signals (modulated signals) input to the power amplification unit 140 have very low power and those in regions where the power of signals is highest. Thus, the values stored in the distortion compensation tables 168 can be quickly updated.

[Overall Operations of First Amplification Apparatus 10]

Overall operations of the first amplification apparatus 10 will now be described.

The signal processing unit 100 of the first amplification apparatus 10 shown in FIG. 2 generates I-channel data and Q-channel data from data to be transmitted.

The pre-distorter 102 imparts distortions to the I-channel data and Q-channel data using compensation data I and Q input from the distortion compensation tables 168-1 and 168-2, respectively, to adjust waveforms of the data.

The D-A units 104-1 and 104-2 performs digital-to-analog conversion of the I-channel data and Q-channel data having adjusted waveforms, respectively, and outputs resultant signals to the quadrature modulation unit 12.

The quadrature modulation unit 12 performs quadrature modulation of the signals input from the D-A units 104-1 and 104-2 using a carrier signal input from the carrier signal generation unit 106 to obtain modulated signals.

The power amplification unit 140 amplifies the modulated signals input thereto and supplies a resultant output signal to the antenna 142.

The antenna 142 transmits the output signal from the power amplification unit 140 as a radio signal.

Further, part of the output signal from the power amplification unit 140 is fed back through the coupling unit 144, the down converter unit 160, and the A-D unit 162 and output to the distortion detecting unit 164.

The distortion detecting unit 164 detects distortion in the output signal from the power amplification unit 140 thus fed back.

As shown in FIGS. 5 and 6, the table value calculating unit 166 reads the distortion of the output signal detected by the distortion detecting unit 164 and exercises adaptive control of the compensation data I and Q stored in the distortion compensation tables 168-1 and 168-2.

The power detecting unit 170 calculates the power value of each of the I-channel data and the Q-channel data.

The address calculating units 172-1 and 172-2 generate addresses in the distortion compensation tables 168-1 and 168-2 associated with the power values of the I-channel data and the Q-channel data detected by the power detecting unit 170, respectively.

The distortion compensation tables 168-1 and 168-2 output items of compensation data I and Q associated with the addresses generated by the address generating units 172-1 and 172-2, respectively, to the pre-distorter 102.

[Problem of First Amplification Apparatus 10]

When the adaptive control process is exercised on the compensation data I and Q according to the perturbation method using power series as described above, similar curves of stored values may be generated depending on the combination of the values of the coefficients $OA_3$, $OA_5$, $OA_7$, $OP_3$, $OP_5$, and $OP_7$.

That is, a plurality of the values of the coefficients $OA_3$, $OA_5$, $OA_7$, $OP_3$, $OP_5$, and $OP_7$ may be combined such that similar curves of stored values are generated.

In other words, the adaptive control process shown in FIG. 5 does not necessarily provide an optimal curve of stored values resulting from an optimal combination of the values of the coefficients $OA_3$, $OA_5$, $OA_7$, $OP_3$, $OP_5$, and $OP_7$, and a curve of stored values obtained by the process may only represent a localized optimal solution.

When a curve of stored values representing a localized optimal solution is obtained, the adaptive control process shown in FIG. 5 can not operate any further, and a curve of stored values resulting in better characteristics cannot be obtained. Thus, distortion of an output signal from the power amplification unit 140 cannot be necessarily minimized.

The number of coefficients may be increased in addition to the coefficients $OA_3$, $OA_5$, $OA_7$, $OP_3$, $OP_5$, and $OP_7$ to allow the adaptive control process shown in FIG. 5 to be performed using coefficients associated with higher-ordered harmonics of the carrier signal. It is therefore possible to obtain an optimal curve of stored values which allows more complicated input/output characteristics of the power amplification unit 140 to be handled.

However, such an increase in the number of coefficients still leaves a possibility that only a localized optimal solution will be obtained by the adaptive control process shown in FIG. 5.

Second Embodiment

A second embodiment of the invention will now be described.

A second amplification apparatus 26 according to the invention described below is an improved version of the first amplification apparatus 10 shown in FIG. 2, and the apparatus is improved such that compensation data I and Q used for adjustment of waveforms of I-channel data and Q-channel data at a pre-distorter 1022 are always optimized.

In order to optimize the compensation data I and Q as thus described, instead of the perturbation method using power series (FIG. 5), a method is employed in which part of the compensation data I and Q is selected as a plurality of representative points and in which third-order spline interpolation is carried out between the plurality of representative points thus selected to optimize the compensation data I and Q.

The method of optimizing the compensation data I and Q by performing third-order spline interpolation between representative points as thus described is hereinafter referred to as "representative point interpolation".

Specifically, boundary points dividing distortion compensation table addresses into a certain number of equal blocks are selected as representative points.

[Third-Order Spline Interpolation]

A further description will now be made on the method of optimizing the compensation data I and Q by performing third-order spline interpolation between representative points.

Figure 7:
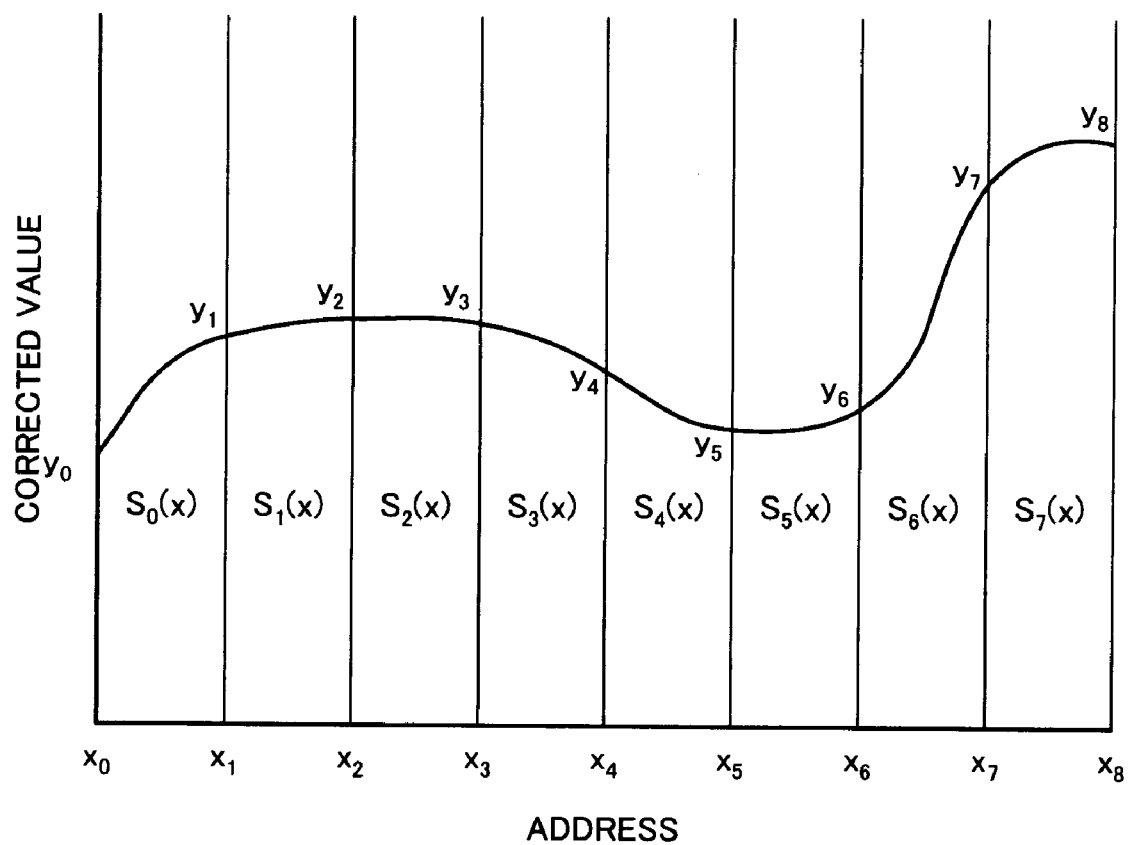
FIG. 7 is a graph showing examples of representative points of a distortion compensation table.

FIG. 7 is a graph showing examples of representative points of a distortion compensation table.

The following description is based on an assumption that representative points of the distortion compensation table ($x_0$, $y_0$), ($x_1$, $y_1$), ($x_2$, $y_2$), ($x_3$, $y_3$), ($x_4$, $y_4$), ($x_5$, $y_5$), ($x_6$, $y_6$), ($x_7$, $y_7$), and ($x_8$, $y_8$) are given as shown in FIG. 7.

Polynomial Si(x) for interpolating an interval $[x_1, x_{i+1}]$ is defined as Equation 1 shown below.

Equation 1

$$S_i(x) = a_i(x-x_i)^3 + b_i(x-x_i)^2 + c_i(x-x_i) + d_i \ (i=0,1,2,\ldots,7) \quad (1)$$

The function represented by the curve shown in FIG. 7 passes through all representative points as indicated by Equations 2 and 3 below (condition 1).

Equation 2

$$S_i(x_1) = a_i(x_i-x_i)^3 + b_i(x_i-x_i)^2 + c_i(x_i-x_i) + d_i = y_i \\ (i=0,1,2,\ldots,7) \quad (2)$$

Equation 3

$$S_i(x_{i+1}) = a_i(x_{i+1}-x_i)^3 + b_i(x_{i+1}-x_i)^2 + c_i(x_{i+1}-x_i) + d_i = \\ y_{i+1} \ (i=0,1,2,\ldots,7) \quad (3)$$

First-order derivatives at boundary points between intervals of the function represented by the curve in FIG. 7 are continuous as indicated by Equation 4 below (condition 2).

Equation 4

$$S'_i(x_{i+1}) = S'_{i+1}(x_{i+1}) \ (i=0,1,2,\ldots,7) \quad (4)$$

Second-order derivatives at boundary points between intervals of the function represented by the curve in FIG. 7 are continuous as indicated by Equation 5 below (condition 3).

Equation 5

$$S''_i(x_{i+1}) = S''_{i+1}(x_{1+1}) \ (i=0,1,2,\ldots,7) \quad (5)$$

Let us assume that $u_i$ represents a differential value of second order when $x=x_i$ as given by Equation 6 below.

Equation 6

$$\begin{aligned} u_i &= S''_i(x_i) \\ &= 6a_i(x_i - x_i) + 2b_i \\ &= 2b_i \end{aligned} \quad (6)$$

Then,

Equation 7

$$b_i = \frac{u_i}{2} \quad (7)$$

Let us assume that $u_{i+1}$ represents a differential value of second order when $x=x_{i+1}$ as given by Equation 8 below.

Equation 8

$$u_{i+1} = S''_i(x_{i+1}) = 6a_i(x_{i+1} - x_i) + 2b_i \quad (8)$$

From Equations 7 and 8, we have Equation 9 as follows.

Equation 9

$$a_i = \frac{u_{i+1} - 2b_i}{6(x_{i+1} - x_i)} = \frac{u_{i+1} - u_i}{6(x_{i+1} - x_i)} \quad (9)$$

From Equation 2, we have Equation 10 as follows.

Equation 10

$$d_i = y_i \quad (10)$$

From Equation 3, we have Equation 11 as follows.

Equation 11

$$\begin{aligned} c_i &= \frac{1}{x_{i+1} - x_i}[y_{i+1} - a_i(x_{i+1} - x_i)^3 + \\ &\quad b_i(x_{i+1} - x_i)^2 + d_i] \\ &= \frac{1}{x_{i+1} - x_i}\left[y_{i+1} - \frac{u_{i+1} - u_i}{6(x_{i+1} - x_i)}(x_{i+1} - x_i)^3 + \\ &\quad \frac{u_i}{2}(x_{i+1} - x_i)^2 - y_i\right] \\ &= \frac{y_{i+1} - y_i}{x_{i+1} - x_i} - \frac{1}{6}(u_{i+1} + 2u_i)(x_{i+1} - x_i) \end{aligned} \quad (11)$$

All coefficients $a_i$, $b_i$, $c_i$, and $d_i$ have been obtained as described above. Since there is an unknown quantity $u_i$, the condition 2 is used.

Then, we have Equations 12 to 16 shown below from Equations 1 and 3.

Equation 12

$$S'_i(x_{i+1}) = S'_{i+1}(x_{i+1}) \quad (12)$$

Equation 13

$$3a_i(x_{i+1} - x_i)^2 + 2b_i(x_{i+1} - x_i) + c_i = \\ 3a_{i+1}(x_{i+1} - x_{i+1})^2 + 2b_{i+1}(x_{i+1} - x_{i+1}) + c_{i+1} \quad (13)$$

Equation 14

$$3a_i(x_{i+1} - x_i)^2 + 2b_i(x_{i+1} - x_i) + c_i = c_{i+1} \quad (14)$$

Equation 15

$$\frac{u_{i+1} - u_i}{2}(x_{i+1} - x_i) + u_i(x_{i+1} - x_i) + \\ \frac{y_{i+1} - y_i}{x_{i+1} - x_i} - \frac{1}{6}(u_{i+1} + 2u_i)(x_{i+1} - x_i) = \\ \frac{y_{i+2} - y_{i+1}}{x_{i+2} - x_{i+1}} - \frac{1}{6}(u_{i+2} + 2u_{i+1})(x_{i+2} - x_{i+1}) \quad (15)$$

Equation 16

$$(x_{i+1} - x_i)u_i + 2(x_{i+2} - x_i)u_{i+1} + (x_{i+2} - x_{i+1})u_{i+2} = \\ 6 \cdot \left[\frac{y_{i+2} - y_{i+1}}{x_{i+2} - x_{i+1}} - \frac{y_{i+1} - y_i}{x_{i+1} - x_i}\right] \ (i = 0,1,2,\ldots,6) \quad (16)$$

We have Equation 17 in the form of a determinant as shown below when $x_{i+1} - x_i = h_i$.

Equation 17

$$\begin{pmatrix} h_0 & 2(x_2-x_0) & h_1 & 0 & 0 & 0 & 0 & 0 & 0 \\ 0 & h_1 & 2(x_3-x_1) & h_2 & 0 & 0 & 0 & 0 & 0 \\ 0 & 0 & h_2 & 2(x_4-x_2) & h_3 & 0 & 0 & 0 & 0 \\ 0 & 0 & 0 & h_3 & 2(x_5-x_3) & h_4 & 0 & 0 & 0 \\ 0 & 0 & 0 & 0 & h_4 & 2(x_6-x_4) & h_5 & 0 & 0 \\ 0 & 0 & 0 & 0 & 0 & h_5 & 2(x_7-x_5) & h_6 & 0 \\ 0 & 0 & 0 & 0 & 0 & 0 & h_6 & 2(x_8-x_6) & h_7 \end{pmatrix} \begin{pmatrix} u_0 \\ u_1 \\ u_2 \\ u_3 \\ u_4 \\ u_5 \\ u_6 \\ u_7 \\ u_8 \end{pmatrix} = \begin{pmatrix} 6\left(\frac{y_2-y_1}{h_1}-\frac{y_1-y_0}{h_0}\right) \\ 6\left(\frac{y_3-y_2}{h_1}-\frac{y_2-y_1}{h_0}\right) \\ 6\left(\frac{y_4-y_3}{h_1}-\frac{y_3-y_2}{h_0}\right) \\ 6\left(\frac{y_5-y_4}{h_1}-\frac{y_4-y_3}{h_0}\right) \\ 6\left(\frac{y_6-y_5}{h_1}-\frac{y_5-y_4}{h_0}\right) \\ 6\left(\frac{y_7-y_6}{h_1}-\frac{y_6-y_5}{h_0}\right) \\ 6\left(\frac{y_8-y_7}{h_1}-\frac{y_7-y_6}{h_0}\right) \end{pmatrix} \quad (17)$$

Only seven expressions are shown in Equation 17, whereas there are nine unknown quantities $u_0$ to $u_8$. When it is assumed that the functions outside the sampling interval are linear functions, $u_0 = u_8 = 0$.

When this condition is applied, Equation 18 shown below holds true.

Equation 18

$$\begin{pmatrix} 2(x_2-x_0) & h_1 & 0 & 0 & 0 & 0 & 0 \\ h_1 & 2(x_3-x_1) & h_2 & 0 & 0 & 0 & 0 \\ 0 & h_2 & 2(x_4-x_2) & h_3 & 0 & 0 & 0 \\ 0 & 0 & h_3 & 2(x_5-x_3) & h_4 & 0 & 0 \\ 0 & 0 & 0 & h_4 & 2(x_6-x_4) & h_5 & 0 \\ 0 & 0 & 0 & 0 & h_5 & 2(x_7-x_5) & h_6 \\ 0 & 0 & 0 & 0 & 0 & h_6 & 2(x_8-x_6) \end{pmatrix} \begin{pmatrix} u_1 \\ u_2 \\ u_3 \\ u_4 \\ u_5 \\ u_6 \\ u_7 \end{pmatrix} = \begin{pmatrix} 6\left(\frac{y_2-y_1}{h_1}-\frac{y_1-y_0}{h_0}\right) \\ 6\left(\frac{y_3-y_2}{h_1}-\frac{y_2-y_1}{h_0}\right) \\ 6\left(\frac{y_4-y_3}{h_1}-\frac{y_3-y_2}{h_0}\right) \\ 6\left(\frac{y_5-y_4}{h_1}-\frac{y_4-y_3}{h_0}\right) \\ 6\left(\frac{y_6-y_5}{h_1}-\frac{y_5-y_4}{h_0}\right) \\ 6\left(\frac{y_7-y_6}{h_1}-\frac{y_6-y_5}{h_0}\right) \\ 6\left(\frac{y_8-y_7}{h_1}-\frac{y_7-y_6}{h_0}\right) \end{pmatrix} \quad (18)$$

The value of $u_i$ is obtained by solving the simultaneous equation shown as Equation 18 using the Gauss' method.

The value of $u_i$ is substituted in Equations 7, 9, and 12 to obtain the values of the coefficients $a_i$, $b_i$, and $c_i$, and the coefficients $a_i$, $b_i$, $c_i$ and $d_i$ are substituted in Equation 1 to perform interpolation.

[Perturbation Method Using Interpolation with Representative Points]

Interpolation using representative points will be further described.

To optimize the compensation data I and Q by interpolation using representative points, the perturbation method may be carried out by performing interpolation using representative points wherein the value of one of representative points of the compensation data I and Q is increased or decreased in a predetermined step of magnitude at a time such that distortion of an output signal from the power amplification unit 140 fed back through the coupling unit 144, the down converter unit 160, and the A-D unit 162 will become smaller.

Figure 8:
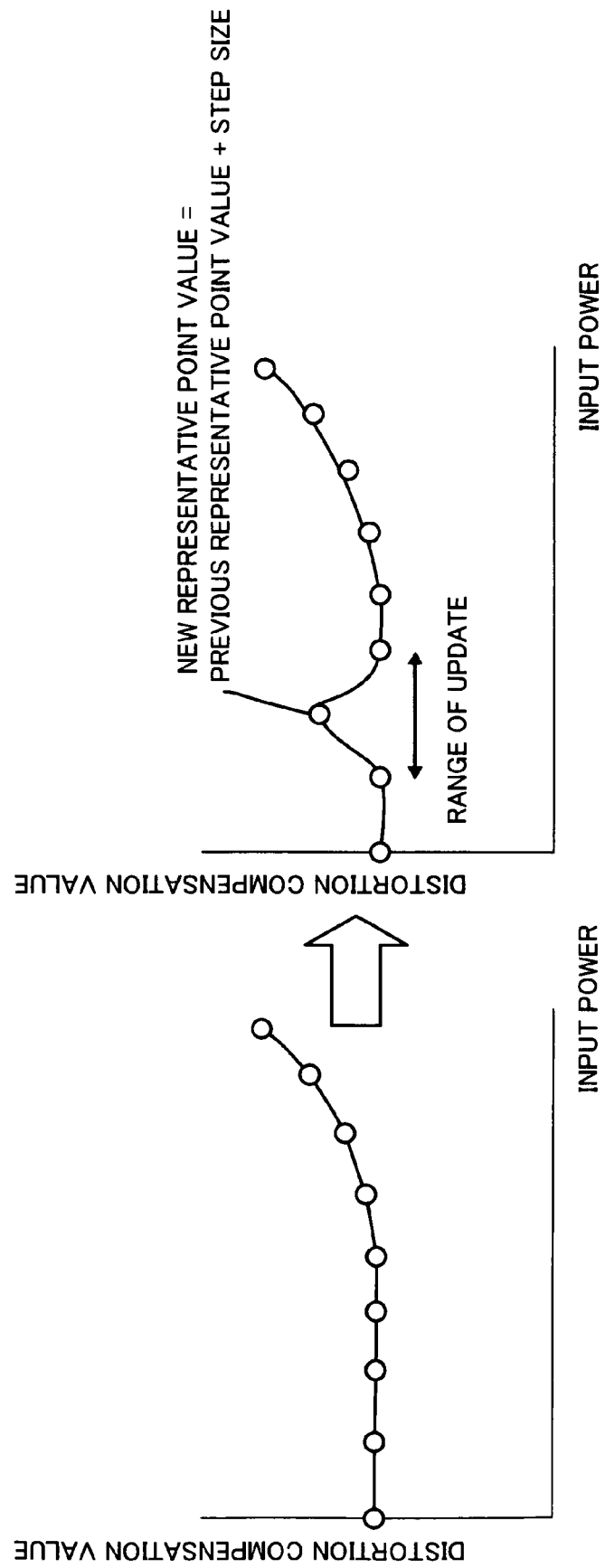
FIG. 8 shows an example of compensation data I and Q updated using an adaptive control process according to the perturbation method based on interpolation using representative points.

FIG. 8 shows an example of compensation data I and Q updated using an adaptive control process according to the perturbation method based on interpolation using representative points.

The perturbation method based on interpolation using representative points makes it possible to obtain a complicated curve of stored values as shown in FIG. 8.

However, when the perturbation method based on interpolation using representative points is carried out on compensation data I and Q which have not been subjected to adaptive control at all, adaptive control can be exercised only on items of the compensation data I and Q associated with a particular value of a signal input to the power amplification unit 140 at a time, and it will take a long time to reduce distortions in a resultant signal output from the power amplification unit 140.

In order to eliminate such a problem, adaptive control may be first exercised on compensation data I and Q by executing the perturbation method using power series, and adaptive control may be further exercised on the compensation data I and Q according to the perturbation method based on interpolation using representative points.

Figure 9:
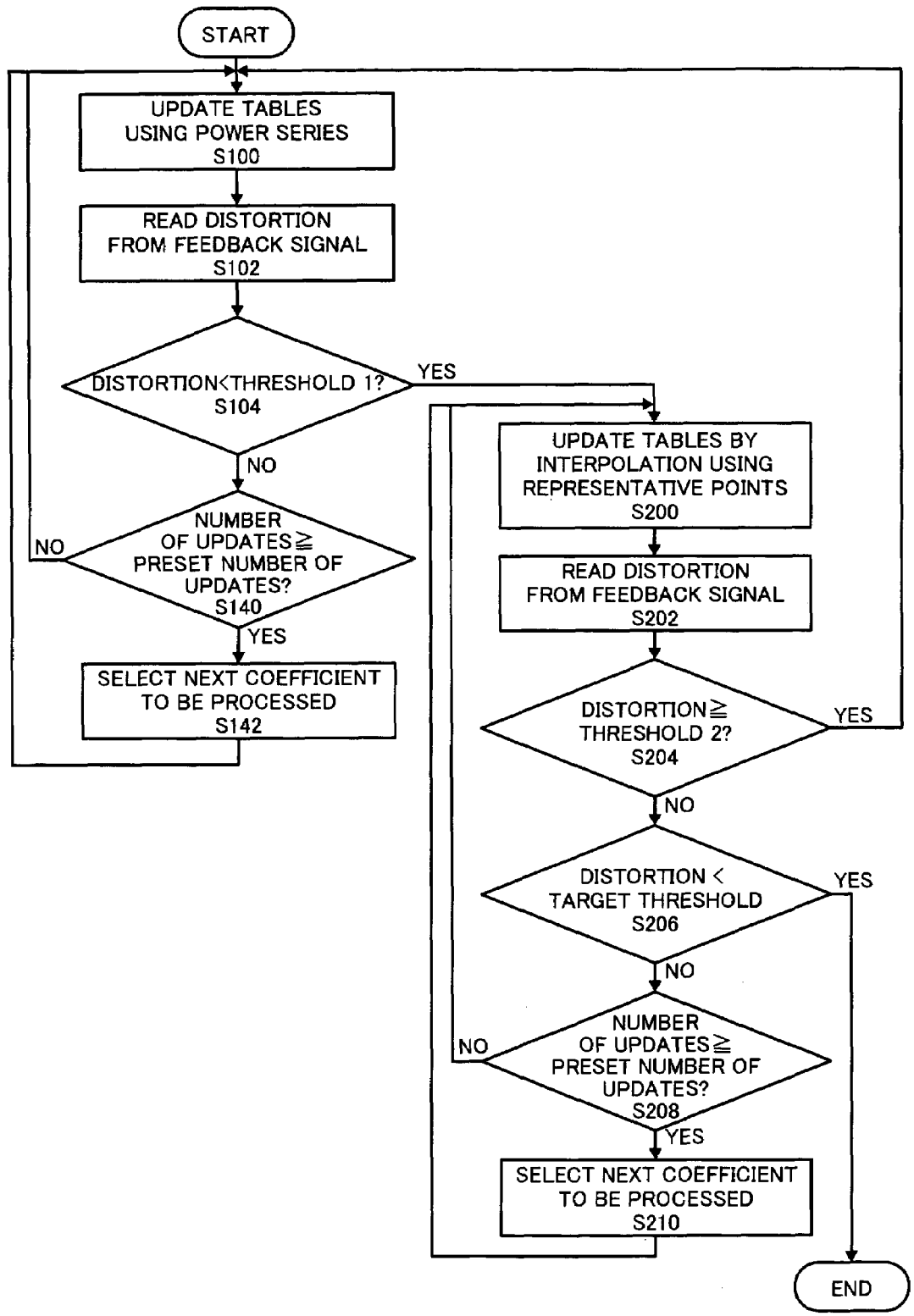
FIG. 9 shows an adaptive control process involving the perturbation method using power series and the perturbation method based on interpolation using representative points.

FIG. 9 shows an adaptive control process (S20) involving the perturbation method using power series and the perturbation method based on interpolation using representative points.

As shown in FIG. 9, the adaptive control process (S20) involving the perturbation method using power series and the perturbation method based on interpolation using representative points is a process which is a combination of the adaptive control process (S10) involving the perturbation method using power series shown in FIG. 5 and an adaptive control process (S200 to S210) according to the perturbation method based on interpolation using representative points.

As shown in FIG. 9, the adaptive control process is carried out on the distortion compensation table starting with, for example, the coefficient $OA_3$ as the object of processing.

At step 100 (S100), the coefficient to be processed is increased or decreased in a predetermined step of magnitude, and all items of the compensation data I are calculated according to Equation 1-1 or 1-2 and stored in the distortion compensation table.

Similarly, the coefficient to be processed is increased or decreased in a predetermined step of magnitude, and all items of the compensation data Q are calculated according to Equation 1-1 or 1-2 and stored in the distortion compensation table to update the same.

Step 102 (S102) reads distortion detected from an output signal of the power amplification unit 140 fed back through the coupling unit 144, the down converter unit 160, and the A-D unit 162.

At step 104 (S104), it is determined whether the read distortion has a value greater than a predetermined first threshold or not.

When the value of the read distortion is greater than the predetermined first threshold, the adaptive control process proceeds to S140. Otherwise, the process proceeds to step 200.

At step 140 (S140), it is determined whether the number of updates of the coefficient of interest has exceeded a preset number of updates.

When the number of updates has exceeded the preset number of updates, the adaptive control process proceeds to step S142. Otherwise, the adaptive control process returns to step 100.

At step 142 (S142), any of the coefficients $OA_3$, $OA_5$, $OA_7$, $OP_3$, $OP_5$, and $OP_7$ which has not been subjected to the adaptive control process yet is chosen as the next object of the adaptive control process, and the adaptive control process returns to step 100.

Then, one representative point to be subjected to the first adaptive control process is selected, and the adaptive control process proceeds to step 200.

At step 200 (S200), the representative point to be processed is increased or decreased in a predetermined step of magnitude, and all items of the compensation data I are calculated according to Equation 1-1 or 1-2 shown above, and the results are stored in the distortion compensation table.

Similarly, the representative point to be processed is increased or decreased in a predetermined step of magnitude to perform third-order spline interpolation. Thus, a value of the representative point is calculated and stored in the distortion compensation table to update the same.

Step 202 (S202) reads distortion detected from an output signal of the power amplification unit 140 fed back through the coupling unit 144, the down converter unit 160, and the A-D unit 162.

At step 204 (S204), it is determined whether the read distortion has a value greater than a predetermined second threshold or not (the second threshold is greater than the first threshold (FIG. 5), in general).

When the value of the read distortion is greater than the predetermined second threshold, the adaptive control process returns to step S100. Otherwise, the process proceeds to step S206.

At step 206 (S206), it is determined whether the value of the read distortion is smaller than a target threshold or not.

When the value of the read distortion is smaller than the target threshold, the adaptive control process is terminated. Otherwise, the adaptive control process proceeds to step S208.

At step 208 (S208), it is determined whether the number of updates of the representative point of interest has exceeded a preset number of updates or not.

When the number of updates of the representative point of interest has exceeded the preset number of updates, the process proceeds to step S210. Otherwise, the process returns to step S200.

At step 210 (S210), any representative point which has not be subjected to the adaptive control process is chosen as the next object of the adaptive control process, and the adaptive control process returns to step S200.

[Second Amplification Apparatus 26]

Figure 10:
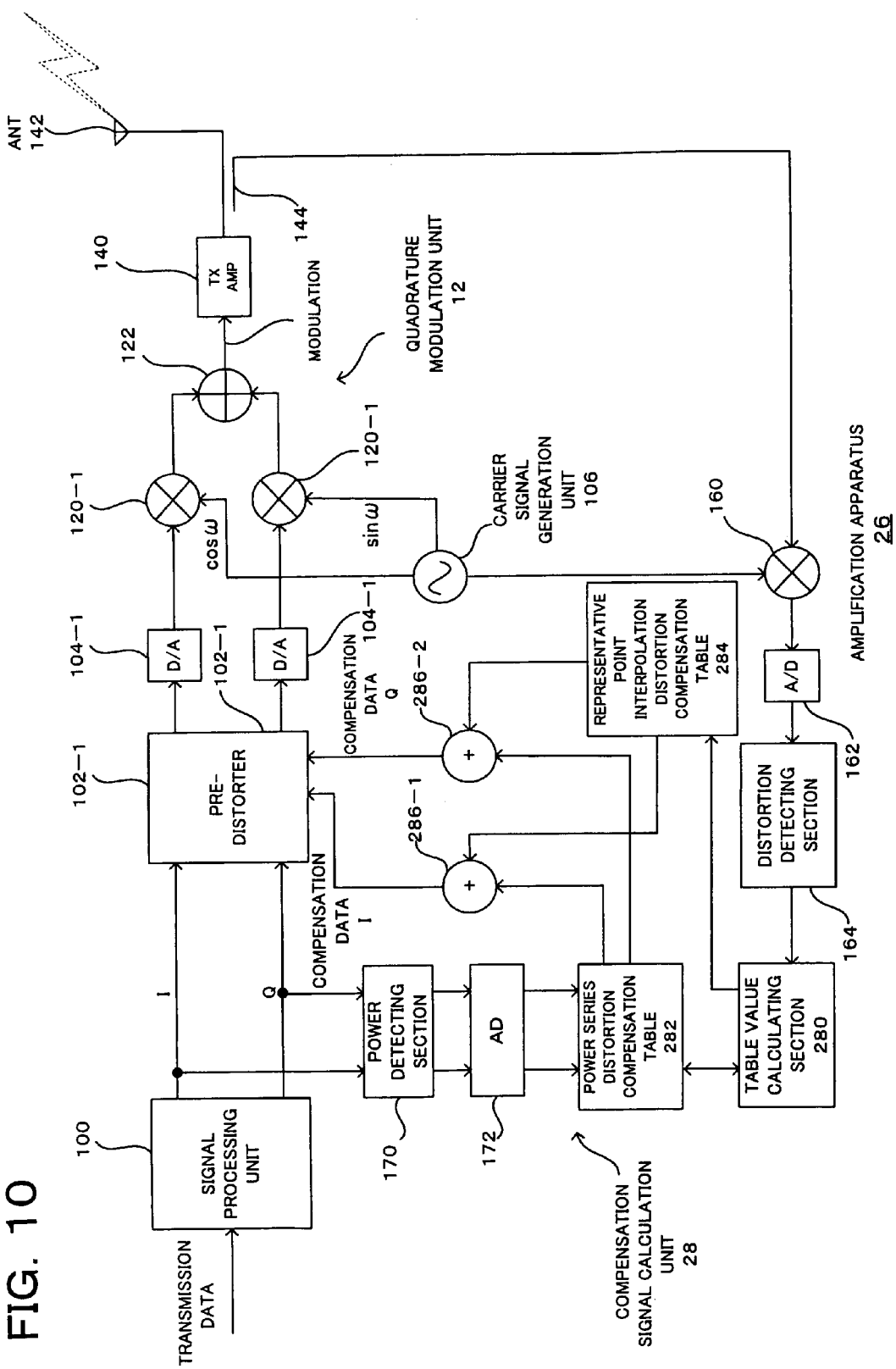
FIG. 10 is a diagram showing a second amplification apparatus according to the invention.

FIG. 10 is a diagram showing a second amplification apparatus 26 according to the invention.

As shown in FIG. 10, the second amplification apparatus 26 includes a signal processing unit 100, a pre-distorter 102, D-A units 104-1 and 104-2, a carrier signal generation unit 106, an quadrature modulation unit 12, a power amplification unit 140, an antenna 142, a coupling unit 144, and a second compensation data calculation unit 28.

That is, the second amplification apparatus 26 has a configuration similar to that of the first amplification apparatus 10 except that the first compensation data calculation unit 16 is replaced by the second compensation data calculation unit 28.

The second compensation data calculation unit 28 includes a down converter unit 160, an A-D unit 162, a distortion detecting unit 164, a power detecting unit 170, address calculating units 172-1 and 172-2, a second table value calculating unit 280, a power series distortion compensation table 282, a representative point interpolation distortion compensation table 284, and adding units 286-1 and 286-2.

That is, the second compensation data calculation unit 28 has a configuration similar to that of the first compensation data calculation unit 16 except that the adding units 286-1 and 286-2 are added and that the distortion compensation tables 168 are replaced by the power series distortion compensation table 282 and the representative point interpolation distortion compensation table 284.

In practice, two each power series distortion compensation tables 282 and representative point interpolation distortion compensation tables 284 are provided in association with compensation data I and Q. However, they are each shown as one block in FIG. 10 for clarity of illustration.

In the amplification apparatus 26, adaptive control processes are performed according to the perturbation method using power series and the perturbation method using representative point interpolation as shown in FIG. 9 by the constituents described above, whereby compensation is provided for distortion of an output signal from the power amplification unit 140.

The second compensation data calculation unit 28 will now be described.

The constituents of the second amplification apparatus 26 excluding the unit 28 are the same as the constituents of the first amplification apparatus 10 (FIG. 2) indicated by like reference numerals.

The adding units 286-1 and 286-2 synthesize compensation data I and Q output by the power series distortion compensation tables and the representative point interpolation distortion compensation tables and output the resultant data to the pre-distorter 102.

When an output signal from the power amplification unit 140 has great distortion, the table value calculating unit 280 performs an adaptive control process on the compensation data I and Q according to the perturbation method using power series as shown in FIGS. 5 and 9 (S10) to update the compensation data I and Q stored in the power series distortion compensation tables 282.

When the distortion of the output signal from the power amplification unit 140 has been sufficiently suppressed by the adaptive control process on the compensation data I and Q performed according to the perturbation method using power series, the table value calculating unit 280 reads the compensation data I and Q from the power series distortion compensation table 282. Then, an adaptive control process (S200 to S210) is performed on the compensation data I and Q according to perturbation method based on interpolation using representative points as shown in FIG. 9. The resultant data are stored in the representative point interpolation distortion compensation tables 284 to update the compensation data I and Q in the representative point interpolation distortion compensation tables 284.

The power series distortion compensation tables 282 output the compensation data I and Q updated by the table value calculating unit 280 to the adding units 286-1 and 286-2, respectively.

The representative point interpolation distortion compensation tables 282 output the compensation data I and Q updated by table value calculating unit 280 to the adding units 286-1 and 286-2, respectively.

[Overall Operations of Second Amplification Apparatus 26]

Overall operations of the second amplification apparatus 26 will now be described.

The signal processing unit 100 of the second amplification apparatus 26 shown in FIG. 10 generates I-channel data and Q-channel data from data to be transmitted.

The pre-distorter 102 imparts distortions to the I-channel data and Q-channel data using compensation data I and Q input from the power series distortion compensation tables 282 and the representative point interpolation distortion compensation tables 284 through the adding units 286-1 and 286-2, respectively, to adjust waveforms of the data.

The D-A units 104-1 and 104-2 performs digital-to-analog conversion of the I-channel data and Q-channel data having adjusted waveforms, respectively, and outputs resultant signals to the quadrature modulation unit 12.

The quadrature modulation unit 12 performs quadrature modulation of the signals input from the D-A units 104-1 and 104-2 using a carrier signal input from the carrier signal generation unit 106 to obtain modulated signals.

The power amplification unit 140 amplifies the modulated signals input thereto and supplies a resultant output signal to the antenna 142.

The antenna 142 transmits the output signal from the power amplification unit 140 as a radio signal.

Further, part of the output signal from the power amplification unit 140 is fed back through the coupling unit 144, the down converter unit 160, and the A-D unit 162 and output to the distortion detecting unit 164.

The distortion detecting unit 164 detects any distortion of the output signal from the power amplification unit 140 thus fed back.

When the distortion of the output signal from the power amplification unit 140 is greater than the first threshold used for the adaptive control process (S10) performed on the compensation data I and Q according to the perturbation method using power series, as shown in FIGS. 5 and 6, the table value calculating unit 280 exercises adaptive control over the compensation data I and Q according to the perturbation method using power series to update the power series distortion compensation tables 282.

When the distortion of the output signal from the power amplification unit 140 is smaller than the first threshold used for the adaptive control process (S10) performed on the compensation data I and Q according to the perturbation method using power series, as shown in FIG. 6, the table value calculating unit 280 exercises the adaptive control process (S200 to S208) over the compensation data I and Q according to the perturbation method based on interpolation using representative points to update the power series distortion compensation tables 282.

Power detecting units 170-1 and 170-2 calculate the power values of the I-channel data and the Q-channel data, respectively.

The address calculating units 172-1 and 172-2 generate addresses in the power series distortion compensation tables 282 and the representative point interpolation distortion compensation tables 284 associated with the power values of the I-channel data and the Q-channel data detected by the power detecting units 170-1 and 170-2, respectively.

The power series distortion compensation tables 282 and the representative point interpolation distortion compensation tables 284 output items of compensation data I and Q associated with the addresses generated by the address generating units 172-1 and 172-2, respectively, to the adding units 286-1 and 286-2, respectively.

The adding units 286-1 and 286-2 synthesize the compensation data I and Q output by the power series distortion compensation tables 282 and the representative point interpolation distortion compensation tables 284 and output resultant data to pre-distorter 102.

[Third Amplification Apparatus 30]

A third amplification apparatus 30 will now be described.

The second amplification apparatus 26 includes the power series distortion compensation tables 282 and the representative point interpolation distortion compensation tables 284 which are provided separately. Thus, switching takes place between the adaptive control process (S10) on the compensation data I and Q according to the perturbation method using power series and the adaptive control process (S200 to S208) on the compensation data I and Q according to the perturbation method based on interpolation using representative points depending on the magnitude of distortion that occurs in the power amplification unit 140. On the contrary, the third amplification apparatus 30 includes power series distortion compensation tables 282 and representative point interpolation distortion compensation tables 284 provided integrally with each other in a configuration in which such switching is not required.

Figure 11:
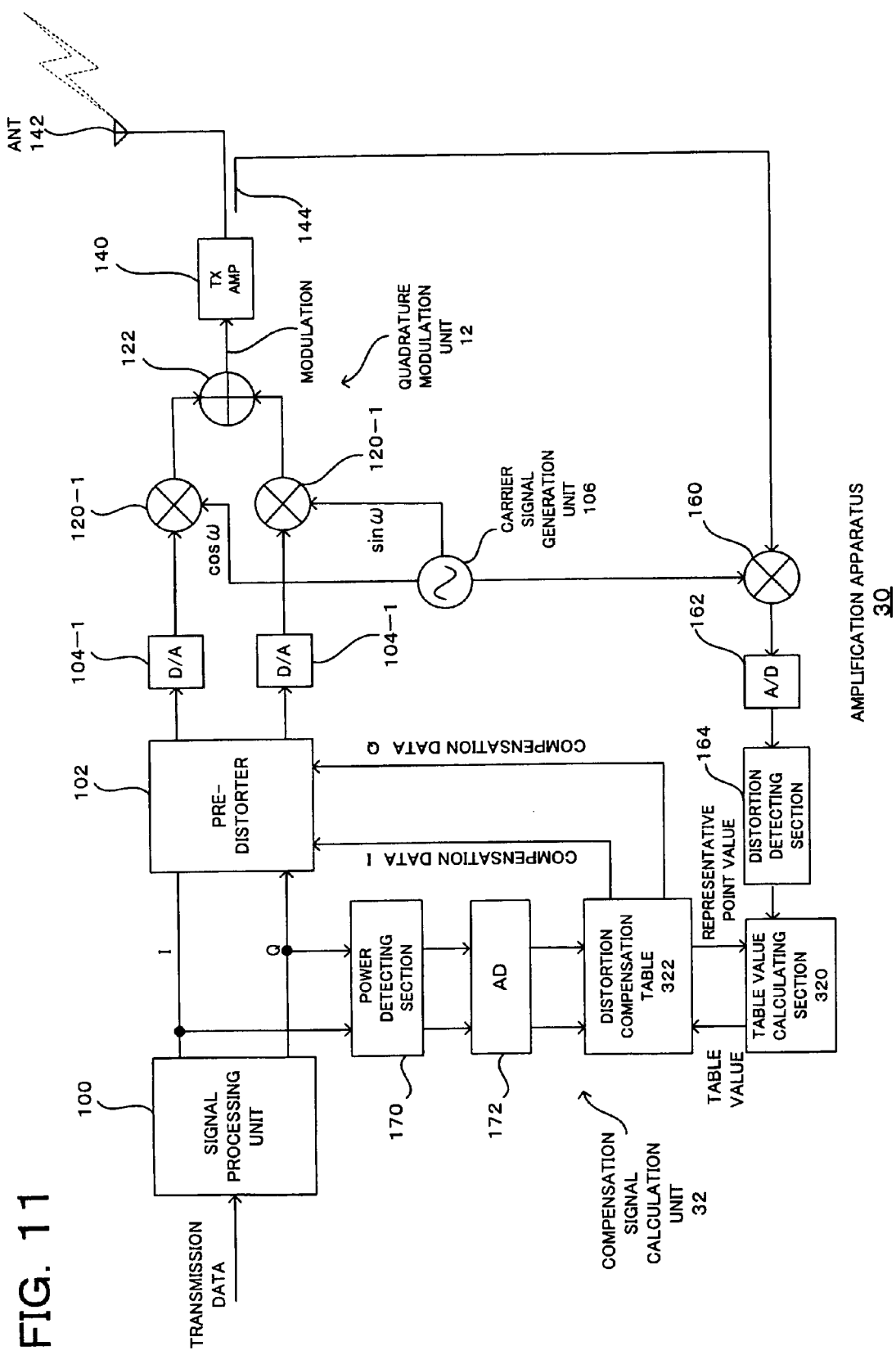
FIG. 11 is a diagram showing a third amplification apparatus according to the invention.

FIG. 11 is a diagram showing the third amplification apparatus 30 according to the invention.

As shown in FIG. 11, the third amplification apparatus 30 includes a signal processing unit 100, a pre-distorter 102, D-A units 104-1 and 104-2, a carrier signal generation unit 106, an quadrature modulation unit 12, a power amplification unit 140, an antenna 142, a coupling unit 144, and a third compensation data calculation unit 32.

That is, the third amplification apparatus 30 has a configuration similar to that of the first amplification apparatus 10 except that the first compensation data calculation unit 16 is replaced by the third compensation data calculation unit 32 or a configuration similar to that of the second amplification apparatus 26 except that the second compensation data calculation unit 28 is replaced by the third compensation data calculation unit 32.

The third compensation data calculation unit 32 includes a down converter unit 160, an A-D unit 162, a distortion detecting unit 164, a power detecting unit 170, address calculating units 172-1 and 172-2, a third table value calculating unit 320, and distortion compensation tables 322.

That is, the third compensation data calculation unit 32 has a configuration similar to that of the second compensation data calculation unit 28 except that the adding units 286-1 and 286-2 are deleted; the second table value calculating unit 280 is replaced by the third table value calculating unit 320; and the power series distortion compensation tables 282 and the representative point interpolation distortion compensation tables 284 are replaced by the distortion compensation tables 322.

In practice, two distortion compensation tables 322 are provided in association with compensation data I and Q. However, they are shown as one block in FIG. 11 for clarity of illustration.

In the third amplification apparatus 30, adaptive control processes are performed according to the perturbation method using power series and the perturbation method using representative point interpolation as shown in FIG. 9 by the constituents described above in the same manner as in the second amplification apparatus 26, whereby compensation is provided for distortion of an output signal from the power amplification unit 140.

The table value calculating unit 320 and the distortion compensation tables 322 will now be described.

The constituents of the third amplification apparatus 30 excluding the unit 320 and the tables 322 are the same as the constituents of the first amplification apparatus 10 (FIG. 2) and the second amplification apparatus 26 (FIG. 10) indicated by like reference numerals.

The table value calculating unit 320 performs adaptive control processes on compensation data I and Q according to the perturbation method using power series and the perturbation method based on interpolation using representative points as shown in FIG. 9 to update the compensation data I and Q which are stored in the distortion compensation tables 322.

The distortion compensation tables 322 output the respective compensation data I and Q updated by the table value calculating unit 320 to the pre-distorter 102.

[Overall Operations of Third Amplification Apparatus 30]

Overall operations of the third amplification apparatus 30 will now be described.

The signal processing unit 100 of the third amplification apparatus 30 shown in FIG. 11 generates I-channel data and Q-channel data from data to be transmitted.

The pre-distorter 102 imparts distortion to each of the I-channel data and Q-channel data using compensation data I and Q input from the distortion compensation tables 322 to adjust waveforms of the data.

The D-A units 104-1 and 104-2 performs digital-to-analog conversion of the I-channel data and Q-channel data having adjusted waveforms, respectively, and outputs resultant signals to the quadrature modulation unit 12.

The quadrature modulation unit 12 performs quadrature modulation of the signals input from the D-A units 104-1 and 104-2 using a carrier signal input from the carrier signal generation unit 106 to obtain modulated signals.

The power amplification unit 140 amplifies the modulated signals input thereto and supplies a resultant output signal to the antenna 142.

The antenna 142 transmits the output signal from the power amplification unit 140 as a radio signal.

Further, part of the output signal from the power amplification unit 140 is fed back through the coupling unit 144, the down converter unit 160, and the A-D unit 162 and output to the distortion detecting unit 164.

The distortion detecting unit 164 detects any distortion of the output signal from the power amplification unit 140 thus fed back.

The table value calculation unit 320 performs adaptive control processes on the compensation data I and Q according to the perturbation method using power series (S10) and the perturbation method based on interpolation using representative points (S200 to S208) to update the distortion compensation tables 322.

The power detecting unit 170 detects the power value of each of the I-channel data and the Q-channel data.

The address calculating units 172-1 and 172-2 generate addresses in the power series distortion compensation table 282 and the representative point interpolation distortion compensation table 284 associated with the power values of the I-channel data and the Q-channel data, respectively, detected by the power detecting unit 170.

The distortion compensation tables 322 output items of the compensation data I and Q associated with the addresses generated by the address calculating units 172-1 and 172-2, respectively, to the pre-distorter 102.

The second amplification apparatus 26 and the third amplification apparatus 30 can avoid the updating of the compensation data I and Q based on a localized optimal solution which can be encountered in the first amplification apparatus 10.

In the amplification apparatus 30, the process of compensating distortion of an output signal from the power amplification unit 140 can be performed in a short time, and distortions can be more effectively reduced than in the first amplification apparatus 10 (FIG. 2).

The invention can be applied to amplification apparatus used for radio communication.

What is claimed is:

1. An amplification apparatus comprising:
   a transmission data power value calculation unit for calculating a power value of digital transmission data to be transmitted;
   a transmission data modifying unit for modifying the transmission data based on compensation data;
   a transmission signal generation unit for generating an analog transmission data from the modified transmission data;
   an amplification unit for amplifying the transmission signal while imparting predetermined characteristics to the same; and
   a distortion detecting unit for detecting distortion of the amplified transmission signal;
   a compensation data table changing unit for changing values in a compensation data table used for generating the compensation data based on the detected distortion; and
   a compensation data unit for generating the compensation data based on the calculated power value of the transmission data and the values in the compensation data table, wherein
   the compensation data table changing unit carries out a first perturbation method or a second perturbation method using the detected distortion of the transmission signal and the values in the compensation data table to change the values in the compensation data table, wherein
   the first perturbation method is a perturbation method using a power series, and the second perturbation method is a perturbation method based on an interpolation using representative values.

2. An amplification apparatus according to claim 1, wherein
   the compensation data table changing unit
   updates the values in the compensation data table according to the perturbation method using power series when the detected distortion of the transmission signal is equal to or greater than a predetermined threshold, and
   updates the values in the compensation data table according to the perturbation method based on interpolation using representative values when the detected distortion of the transmission signal is equal to or greater than another predetermined threshold.

* * * * *